(12) United States Patent
Thon (10) Patent No.: US 7,075,363 B1
(45) Date of Patent: Jul. 11, 2006

(54) TUNED CONTINUOUS TIME DELAY FIR EQUALIZER

(75) Inventor: Lars Erik Thon, Mountain View, CA (US)

(73) Assignee: Aeluros, Inc., Mountain View, CA (US)

( * ) Notice: Subject to any disclaimer, the term of this patent is extended or adjusted under 35 U.S.C. 154(b) by 0 days.

(21) Appl. No.: 10/615,093

(22) Filed: Jul. 7, 2003

(51) Int. Cl.
*H03B 1/00* (2006.01)
*H03K 5/00* (2006.01)
*H04B 1/10* (2006.01)

(52) U.S. Cl. ............... 327/552; 327/558; 327/270; 375/232; 708/819

(58) Field of Classification Search ............ 327/551, 327/552, 553, 558, 269, 270, 271, 283; 375/232; 708/819, 300, 301, 323; 333/28 R, 138, 333/139, 166, 167
See application file for complete search history.

(56) References Cited

U.S. PATENT DOCUMENTS

| | | | | |
|---|---|---|---|---|
| 4,475,170 A | * | 10/1984 | Haque ................... | 708/819 |
| 4,922,141 A | * | 5/1990 | Lofgren et al. ........... | 327/158 |
| 5,307,028 A | * | 4/1994 | Chen .................... | 331/1 A |
| 5,428,309 A | * | 6/1995 | Yamauchi et al. ........ | 327/158 |
| 5,563,819 A | * | 10/1996 | Nelson .................. | 708/819 |
| 5,592,340 A | * | 1/1997 | Minuhin et al. ......... | 360/46 |
| 5,648,988 A | * | 7/1997 | Iwamatsu et al. ........ | 375/232 |
| 5,650,954 A | * | 7/1997 | Minuhin ................ | 708/819 |
| 5,854,717 A | * | 12/1998 | Minuhin ................ | 360/65 |
| 6,035,320 A | * | 3/2000 | Kiriaki et al. ........... | 708/819 |
| 6,233,107 B1 | * | 5/2001 | Minuhin ................ | 360/51 |
| 6,314,444 B1 | * | 11/2001 | Minuhin et al. ......... | 708/819 |
| 6,385,239 B1 | * | 5/2002 | Okamoto et al. ........ | 375/232 |
| 6,492,922 B1 | * | 12/2002 | New .................... | 341/120 |
| 6,529,926 B1 | * | 3/2003 | Capofreddi ............. | 708/316 |
| 6,721,427 B1 | * | 4/2004 | Yamada ................. | 381/71.14 |
| 2003/0090339 A1 | * | 5/2003 | Yu et al. ................ | 333/167 |
| 2004/0131128 A1 | * | 7/2004 | Roy et al. .............. | 375/295 |
| 2004/0193669 A1 | * | 9/2004 | Shirani ................. | 708/819 |
| 2004/0196085 A1 | * | 10/2004 | Shen ................... | 327/277 |

* cited by examiner

*Primary Examiner*—Tuan T. Lam
(74) *Attorney, Agent, or Firm*—Stattler Johansen & Adeli LLP (57) ABSTRACT

An analog finite impulse response ("FIR") filter generates a continuous time output using a chain of tunable delay elements. The tunable delay elements generate a time delay in an input signal. A calibration circuit, consisting of a control loop, tunes the delay elements to provide precision in the time delay response of the delay elements. The control loop generates a delay adjustment, based on the period of reference signals, and the phase adjustment is used to tune the parameters of the delay elements. The tunable delay elements may comprise any combination of transmission lines, lumped elements and semi-lumped elements.

20 Claims, 12 Drawing Sheets

TUNED CONTINUOUS TIME DELAY FIR EQUALIZER

BACKGROUND OF THE INVENTION

1. Field of the Invention

The present invention is directed toward the field of electronic circuits, and more particularly toward a high-speed finite impulse response ("FIR") equalizer.

2. Art Background

Data communication systems transport data at speeds defined by a predetermined data rate. The speed of transmitting data in modern broadband communication systems has rapidly increased in recent years. Today, data rates as high as 40 gigabits per second ("Gbps") are required, as exemplified by the OC-768 optical networking standard.

Some data communication systems utilize serial data transmission. For example, electronic circuits utilize serial data transmission to transmit data among one or more circuits. In general, serial data transmission involves transmitting bits in a single bit stream at a predetermined data rate. The data rate is expressed as the number of bits transmitted per second ("bps"). Typically, to transfer data between circuits, the sending circuit employs a transmitter that modulates and sends data using a local clock. The local clock provides the timing for the bit rate. The receiving circuit employs a receiver to recover the data, and in some cases, the clock. The receiver circuit recovers the serial bit stream of data by sampling the bit stream at the specified data rate.

Equalizer circuits are used to condition and shape the frequency content of signals for subsequent processing. High-speed serial links, such as copper and fiber links, benefit from equalization of both received and/or transmitted signals. One type of equalizer is known as a finite impulse response ("FIR") filter. In general, a FIR filter shapes the waveform to exhibit particular characteristics. A FIR filter typically consists of delay elements, multipliers, and a summing circuit. The multipliers include coefficients that correspond to the impulse response of the filter, and the summing circuit sums the constituent components output from the multipliers. Typically, FIR filters are implemented in digital logic. For a digital implementation, shift registers are used as the delay elements (i.e., a signal sample of the signal is shifted through a series of registers to delay the signal). However, for high-speed circuit applications, such as high-speed serial links, the digital solutions are not feasible. Consequently, FIR filters employed in high-speed applications operate on either discrete time or continuous time analog signals.

As disclosed herein, the present invention includes techniques for FIR filter equalization for use in high-speed applications.

SUMMARY OF THE INVENTION

An analog finite impulse response ("FIR") filter generates a continuous time output. The FIR filter includes a chain of delay elements. The delay elements generate a time delay in the signal. A calibration circuit tunes the delay elements to provide precision in the phase response of the delay elements. The tunable delay elements may comprise any combination of transmission lines, lumped elements and semi-lumped elements. The output of each delay element is coupled to a multiplier. In turn, each multiplier has a corresponding coefficient that defines the filter response. The output of the multipliers is summed to generate the equalized signal.

In one embodiment, the calibration circuit includes a control loop. The control loop receives reference signals from the delay elements, and generates a phase adjustment based on the delay of the reference signals. The delay elements comprise selectable parameters to adjust the phase response of the delay elements. In one embodiment, the control loop comprises a phase detector and a loop filter. The phase detector measures a phase difference between a reference signal, input to the chain of delay elements, and a signal output from the chain of delay elements. The loop filter generates a phase adjustment based on the phase difference. The phase adjustment is used to tune the parameters of the delay elements.

In one embodiment, the FIR filter comprises tunable (master/slave) reference delay elements. For this embodiment, the calibration circuit includes a chain of reference delay elements. The reference delay elements receive a reference signal and generate a delay for the reference signal based on at least one tunable parameter. The parameters of the reference delay elements are tuned, and the tuned parameters are transferred to the delay elements that perform the delay for the FIR filter.

DETAILED DESCRIPTION

Figure 1:
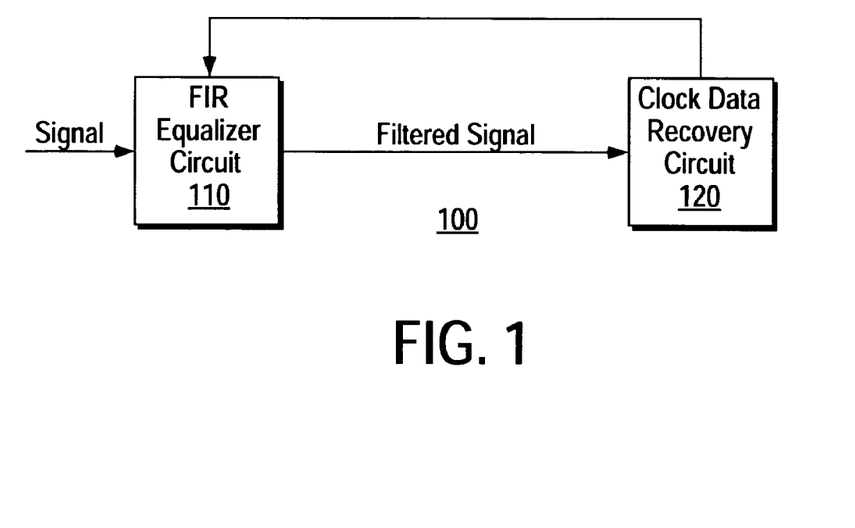
FIG. 1 is a block diagram illustrating one embodiment of a FIR equalizer and clock data recovery circuits.

One application for a FIR equalizer circuit is for use in conjunction with a clock data recovery circuit. FIG. 1 is a block diagram illustrating one embodiment of a FIR equalizer and clock data recovery circuits. As shown in FIG. 1, a signal, such as a serial data stream, is input to a FIR equalizer circuit 110. In turn, the FIR equalizer circuit 110 filters or conditions the signal, in accordance with a predetermined impulse response function, for input to clock data recovery circuit 120.

In general, clock data recovery circuits recover the data at the receiver without receiving the sampling clock from the transmitter (i.e., a separate clock is generated at the receiver). Most clock data recovery circuits "over sample" the data to recover clock and data. In one over sampling method, the incoming data is first sampled at the bit cycle transition point to determine whether the phase of the clock at the receiver leads or lags the phase of the bit transitions in the serial bit stream. In addition, the serial bit stream is sampled at the center of the bit cycle to determine the state or value of the data for that bit cycle. If the semiconductor technology that implements the receiver is fast enough, the rate of the sampling clock at the receiver is equal to the bit rate. For example, if the bit rate for a serial data link is 40 giga bits per second, then the clock used to sample the data may have a frequency of 40 gigahertz ("GHz"). As described more fully below, the clock data recovery circuit benefits from a continuous time equalized signal.

Figure 2:
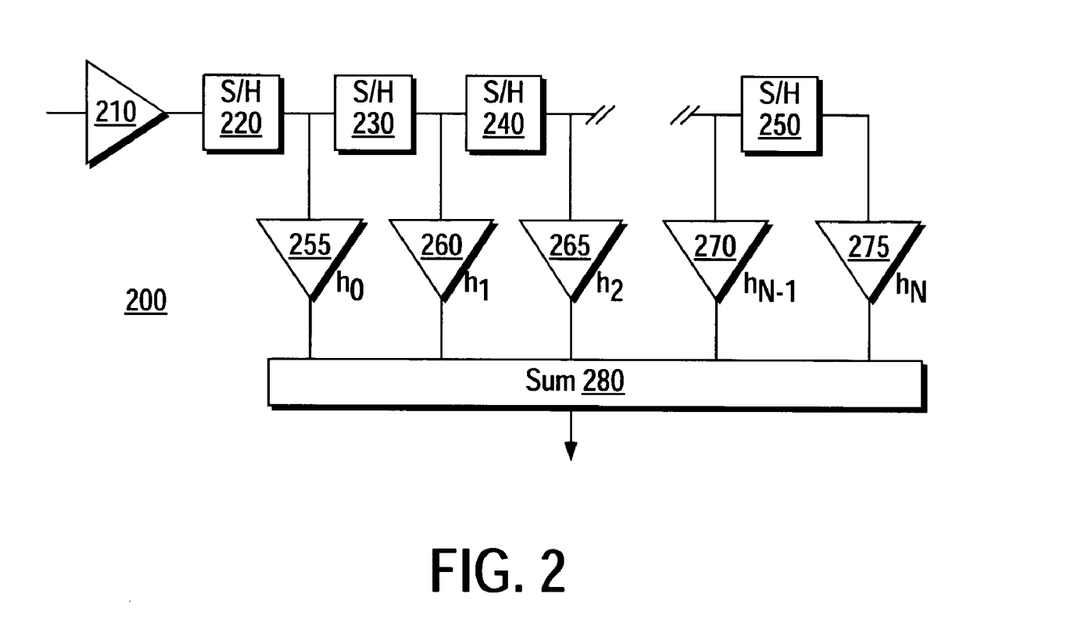
FIG. 2 illustrates one embodiment for a discrete time analog FIR filter.

One common implementation for the FIR filter, an analog implementation, samples the input signal. An analog FIR filter that samples the input signal is referred to as a discrete time FIR filter. FIG. 2 illustrates one embodiment for a discrete time analog FIR filter. In its simplest form, the discrete time FIR filter consists of a chain of analog sample and hold circuits. The output of each sample and hold circuit is input to an analog multiplier. Specifically, for circuit 200 shown in FIG. 2, a buffer 210 buffers the input signal for input to the chain of sample and hold circuits (220, 230, 240 and 250). For this example, there are "N" sample and hold circuits. The output of each sample and hold circuit is input to an analog multiplier (255, 260, 265, 270, and 275), as shown in FIG. 2. Coefficients for the analog multipliers generate the impulse response of the filter. The coefficients are represented in FIG. 2 by the variable "h." The output of each analog multiplier (265, 260, 265, 270 and 275) is input to a summing circuit 280. The summing circuit 280 sums the signal components output from the analog multipliers. The output of the summing circuit 280 constitutes the equalized signal.

The discrete time FIR filter has several drawbacks for use in high-speed circuits. One of the drawbacks of the discrete time FIR filter is that the absolute sampling phase of the sample—hold circuits may not be controllable. For example, if clock data recovery is performed after the equalization (e.g., FIG. 1), an open loop system exists, and thus the absolute sampling phase is not controllable. To address this issue, a fractionally spaced equalizer may be used. A fractionally spaced equalizer has a sampling period, T/n, equal to a fraction of the data period, T. Although the fractionally spaced equalizer is less sensitive to variations in sampling phase, it has the additional drawback of requiring the sampling and computational circuits to operate at high frequencies. In addition, a discrete time output from the FIR equalizer may not be suitable for driving a clock data recovery circuit.

Some applications for the FIR equalizer benefit from a continuous waveform output. For example, clock data recovery circuits, employed in serial links, typically are designed to operate on a continuous waveform. To optimize operation for these applications, a FIR equalizer generates a continuous waveform at the output of the FIR filter. For purposes of nomenclature, a FIR filter that generates a continuous waveform is referred to as a "continuous time FIR."

Figure 3:
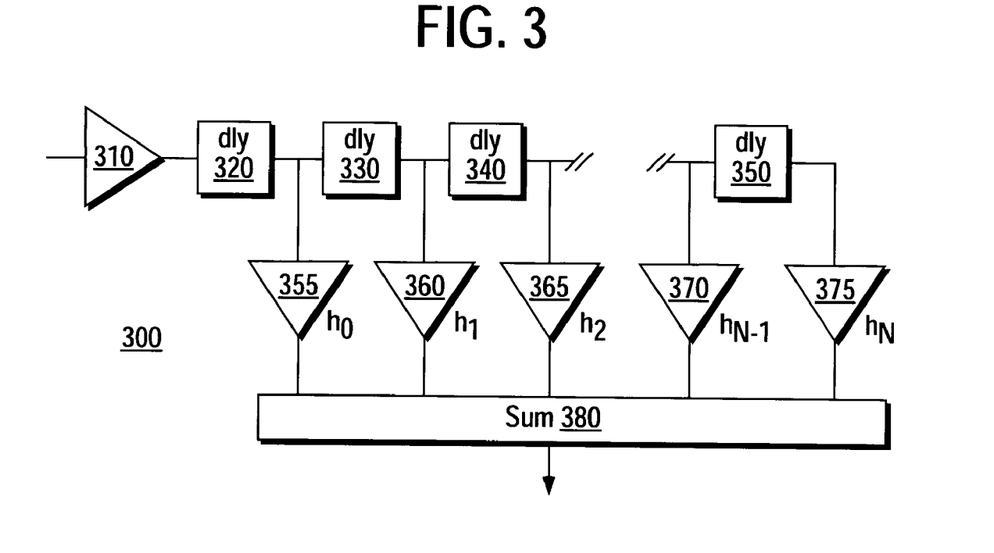
FIG. 3 illustrates one embodiment for a continuous time FIR.

FIG. 3 illustrates one embodiment for a continuous time FIR. A continuous time FIR 300 includes an input buffer 310 coupled to a chain of delay elements (320, 330, 340 and 350). The delay elements introduce a phase shift for the signal. Thus, as the input signal is propagated through the chain of delay elements, additional time delay, or phase shift, is introduced. The signal, output from each delay element, is input to a corresponding analog multiplier (355, 360, 365, 370 and 375), as shown in FIG. 3. The outputs from the analog multipliers are combined in a summing circuit 380.

Figure 4:
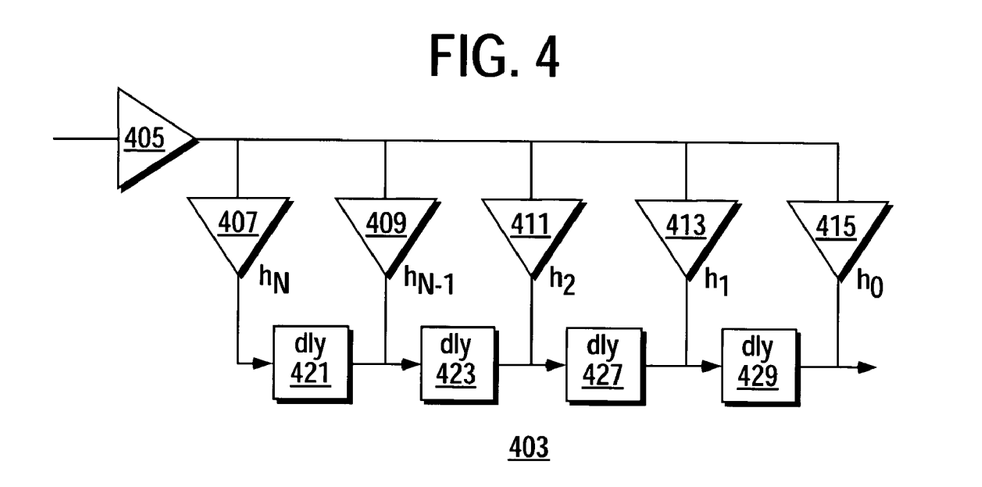
FIG. 4 illustrates another embodiment for a continuous time FIR

FIG. 4 illustrates another embodiment for a continuous time FIR. For this embodiment, the analog continuous-time FIR is transposed from the analog continuous time FIR of FIG. 3. The continuous-time FIR 403 receives an input signal at buffer 405. The buffered output is input to a plurality of analog multipliers (407, 409, 411, 413 and 415), as shown in FIG. 4. The output of the analog multipliers is input to delay elements (421, 423, 427 and 429). Specifically, the output of the first analog multiplier (407) is input to a first delay element (421). The output of the first delay element (421) and the output of the second analog multiplier (423) are input to the second delay element (423). The multiplied values and the delayed signals are summed in the manner as shown in FIG. 4.

When using a continuous time FIR filter, it is difficult to ensure an accurate sample delay in the delay elements. The precision of the sample delay is critical. One prior art approach used in magnetic recording channels implements an analog continuous time FIR using delay elements constructed from bipolar active all-pass filters based on lumped circuit elements. This technique is difficult to implement at high speeds, such as in 10 or 40 Gb/s serial links. Under these conditions, a unit delay of the FIR filter is only 100 pico seconds (ps), and thus is very small compared to the group delay of a typical active filter implemented using CMOS technology. Thus, to achieve high data rates, active components, such as high pass filters, are not appropriate.

To permit implementation in high-speed circuits, the techniques of the present invention utilize one or more passive components to implement the delay elements. As described more fully below, the delay elements may be implemented using any combination of transmission lines, stubs, or lumped or semi lumped resistances and reactances.

Figure 5:
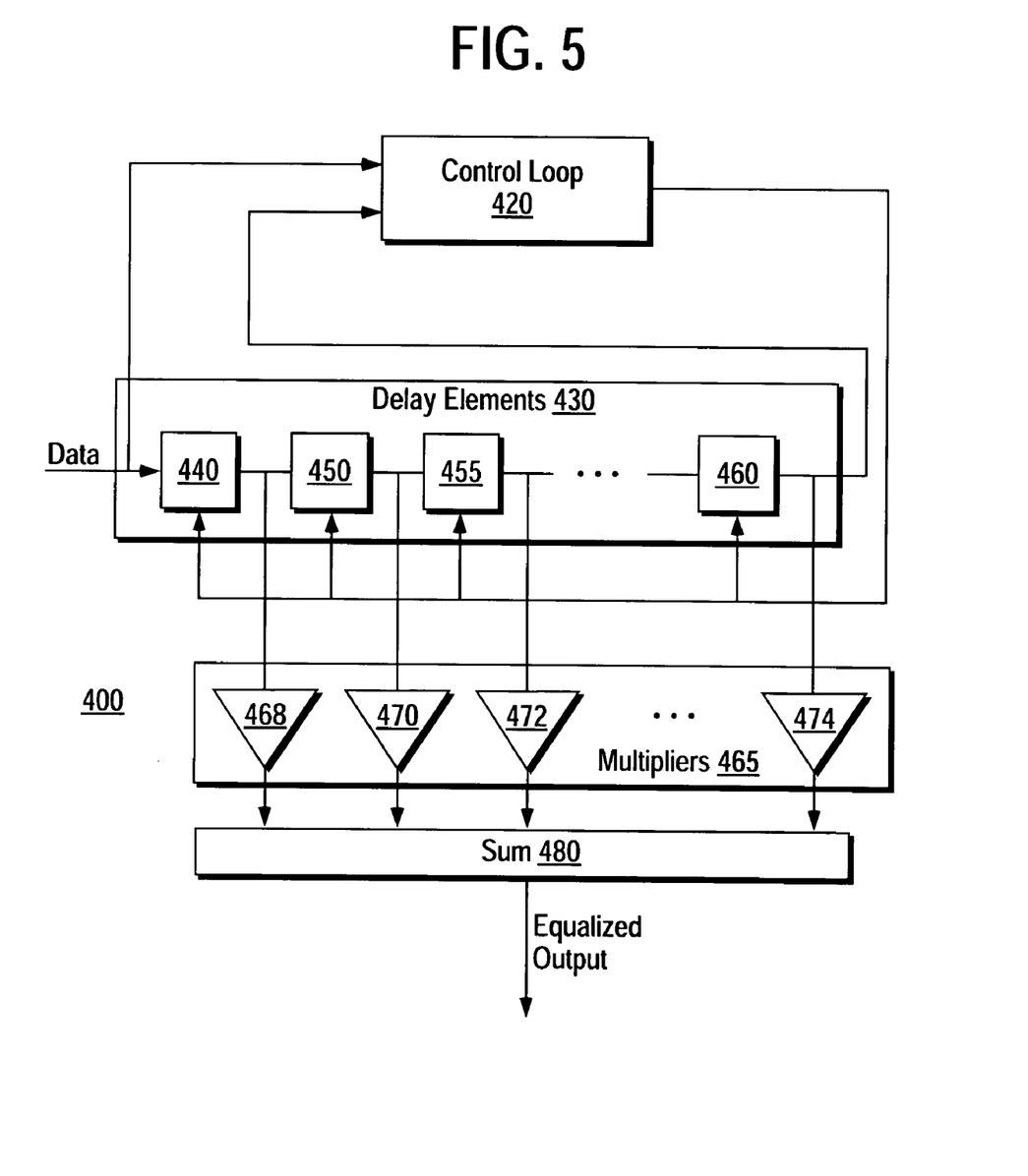
FIG. 5 is a block diagram illustrating one embodiment for a continuous time FIR that uses tuned delay elements.

In one embodiment, to ensure accurate delay in the delay elements, a delay line, configured in a delay lock loop, is used. The delay lock loop is automatically tuned or calibrated by adjusting parameters in the delay elements. FIG. 5 is a block diagram illustrating one embodiment for a continuous time FIR that uses tuned delay elements. Similar to the analog continuous time FIR of FIG. 3, FIR 400 includes a plurality of the delay elements, "N" (440, 450, 455, and 460). The output of each of the "N" delay elements is coupled to the input of an analog multiplier (468, 470, 472 and 474). The output of the analog multipliers 465 is input to a summing circuit 480, to generate the equalized signal output.

As shown in FIG. 5, FIR 400 includes control loop 420. In general, control loop 420 receives, as inputs, sample signals from the delay elements, and generates, as an output, adjustments to alter the parameters of the delay elements. The parameters control the time delay or phase of the delay elements. For the embodiment shown in FIG. 5, the input to the first delay element (440) is the first input to control loop 420. The second input to control loop 420 is the output of the last delay element 460. The control loop 420 measures the phase difference between the inputs (input to delay element 440 and output from delay element 460) to generate a phase error. Although the embodiment of FIG. 5 measures the phase difference between the input of the first delay element and the output of the last delay element for delay elements 430, different sample points from the delay elements may be used without deviating from the spirit or scope of the invention.

The phase error is input to a loop filter to control the loop response of the delay lock loop. Based on the loop filter response, an adjustment is generated to adjust the phase of delay elements 430. Thus, the delay elements 430 are tuned or calibrated to ensure a precise sample delay for the FIR circuit. As described more fully below, the phase adjustments may be implemented using any practical method, including switching on and off capacitances, resistances, inductances, and (stub) transmission lines in any parallel and/or serial fashion. For example, in one embodiment, the delay elements are implemented using transmission line segments loaded with switched capacitors.

The tuned transmission line forms the delay portion of a continuous time FIR filter. Consequently, the continuous time output of the FIR filter may be sampled at any time by a successive clock data recovery circuit. The continuous time output of the FIR filter, although removes the need for fractional clocking and improves overall performance, requires a high bandwidth for the FIR coefficient analog multipliers. Thus, the FIR coefficient analog multipliers must operate fast enough so as to not distort the output of the FIR filter. This embodiment is sensitive to non-ideal magnitude and phase response of the delay elements. The FIR filter coefficients may be adjusted to at least partially alleviate non-ideal magnitude and phase response. In another embodiment, the tuning elements may include passive filters and/or external intra-stage active amplifiers to reduce or remove the non-ideal magnitude/phase response.

Figure 6:
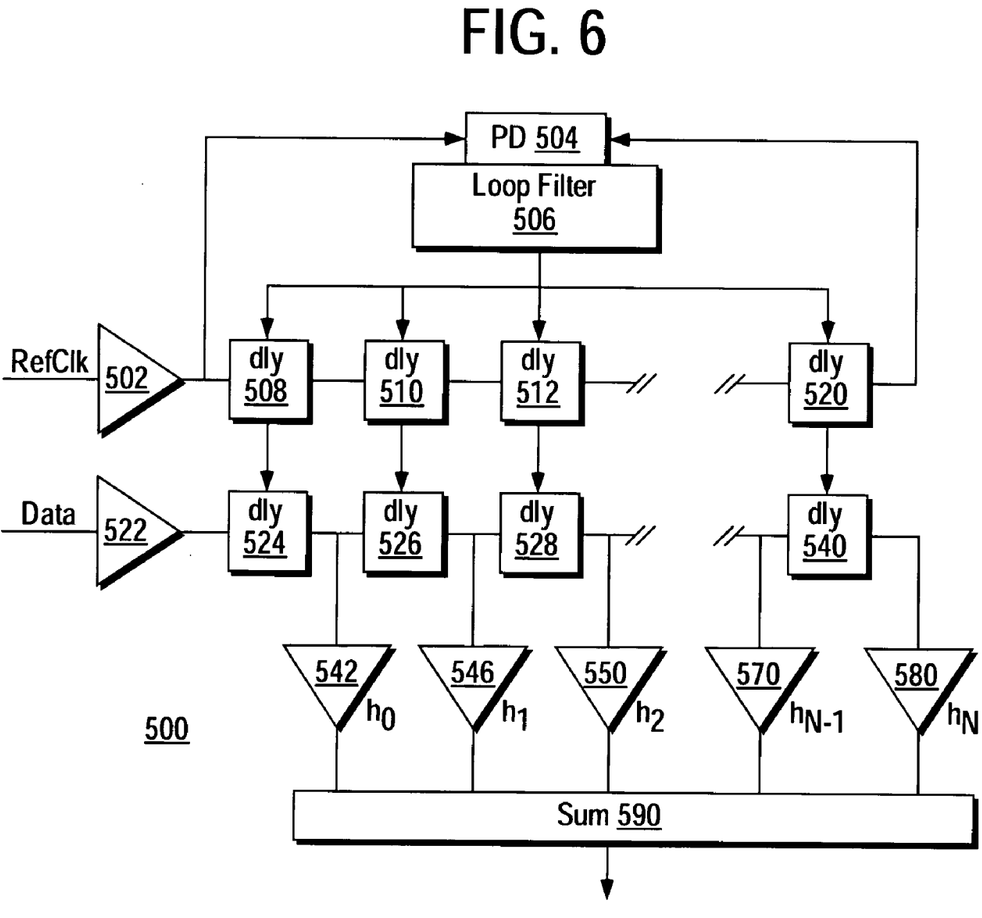
FIG. 6 illustrates another embodiment for a tuned continuous time FIR filter.

FIG. 6 illustrates another embodiment for a tuned continuous time FIR filter. Specifically, FIG. 6 illustrates one embodiment of a so-called master-slave tuned continuous time FIR filter. For this embodiment, FIR filter 500 includes tuned reference delay elements (508, 510, 512 and 520). The tuned reference delay elements (508, 510, 512 and 520) are used exclusively to tune the delay elements for the FIR filter (524, 526, 528 and 540). For the embodiment of FIG. 6, the control loop is implemented using a phase detector ("PD") 504 and a loop filter 506. A reference clock, RefClk, is input to a buffer 502, for subsequent input to the chain of reference delay elements (508, 510, 512 and 520). The output of the control loop, loop filter 506, is input to each reference delay element. As described more fully below, the loop filter generates a value to adjust parameter(s) in the delay element to control the time delay of the element.

In operation, the reference delay elements are tuned prior to or during the operation of the circuit. Specifically, the reference clock is input to the chain of reference delay elements, and a loop operation is performed: a phase difference between the input to reference delay element 508 and the output from reference delay element 520 is calculated; the phase difference is conditioned based on the parameters of loop filter 506; and parameters within the reference delay elements are adjusted in accordance with the output of loop filter 506. These operations of the loop are executed until the desired phase characteristics in the reference delay elements are obtained. Once the delay parameters in the reference delay elements (508, 510, 512 and 520) have been set, the parameters are transferred to the FIR delay elements (524, 526, 528 and 540). Once tuned, the operation of continuous time FIR filter 500 is performed in accordance with FIR filter 300 (FIG. 3). Thereafter, the reference delay elements, and associated control loop, may be periodically or continually used to calibrate the phase response in the reference delay elements, and subsequently, the delay elements for the continuous time FIR filter.

Figure 7:
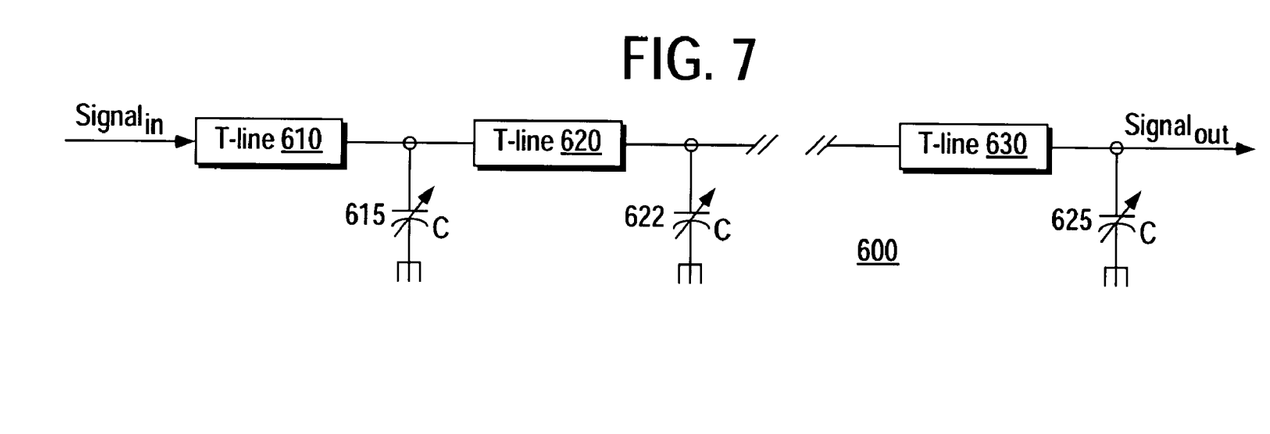
FIG. 7 illustrates one embodiment for implementing a delay element for a tuned continuous time FIR filter.

FIG. 7 illustrates one embodiment for implementing a delay element for a tuned continuous time FIR filter. For this embodiment, the delay elements 600 are implemented using transmission lines and a means to vary the capacitance. The variable capacitance may include a varactor, or a plurality of capacitors switched to obtain the desired capacitance. As shown in FIG. 7, a plurality of transmission line segments, one segment for each delay element, are used to implement the delay elements. For this embodiment, the variable capacitors (615, 622 and 625), one coupled to the output of each transmission line segment, form the parameter to tune the phase of the delay element. Thus, the phase is adjusted by varying the capacitance.

Figure 8:
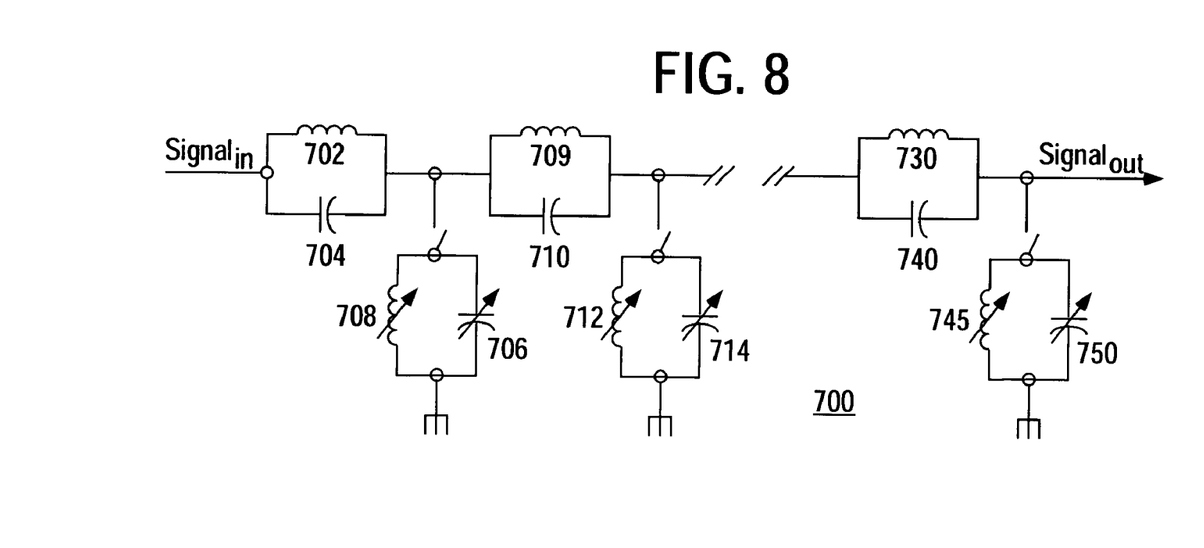
FIG. 8 illustrates another embodiment for implementing a delay element for a tuned continuous time FIR filter.

FIG. 8 illustrates another embodiment for implementing a delay element for a tuned continuous time FIR filter. For the embodiment of FIG. 8, lumped parameters, consisting of inductors and capacitors, are used to implement the delay elements. A first delay element comprises capacitor 704 and inductor 702, a second delay element comprises capacitor 710 and inductor 709, and a third delay element comprises capacitors 740 and inductor 730. The parameters of the delay elements are changed, to adjust the phase response, by switching on and off additional inductors and/or capacitors. Specifically, variable capacitor 706 and variable inductor 708 are selectively introduced to tune the delay element. The variable inductance and capacitance may be generated by any well-known means of increasing or decreasing inductance or capacitance, respectively. Although the delay elements 700 shown in FIG. 8 switch variable capacitances and inductances parallel to the delay element, any combination of parallel or series inductance-capacitance may be used without deviating from the spirit or scope of the invention.

Figure 9:
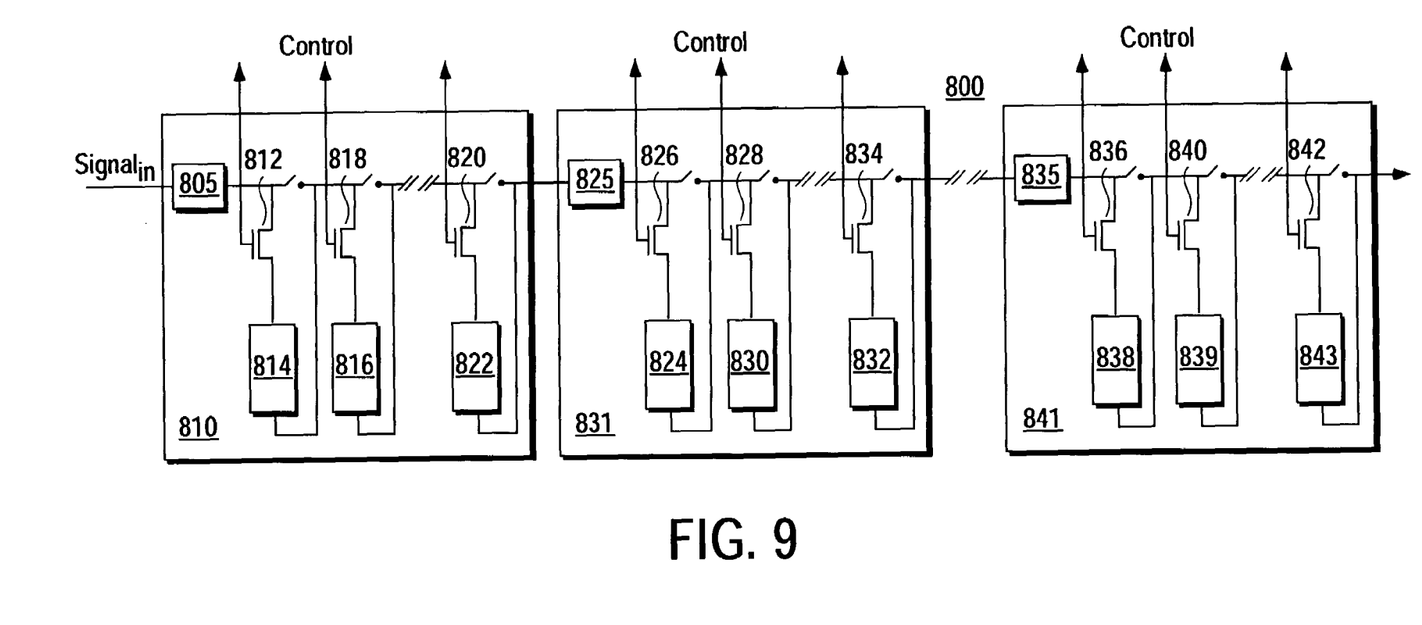
FIG. 9 illustrates another embodiment for implementing a delay element for a tuned continuous time FIR filter.

FIG. 9 illustrates another embodiment for implementing a delay element for a tuned continuous time FIR filter. For this embodiment, a delay element, implemented with a transmission line or lumped circuit elements, is tuned by coupling one or more transmission line stubs to the fixed delay element. Specifically, as shown in FIG. 9, delay element 810 consists of a fixed delay element 805 and a plurality of transmission line stubs (814, 816 and 822). The transmission line stubs (814, 816 and 822) are selectively coupled to the fixed delay element 805 through transistors 812, 818 and 820, respectively. Also, as shown in FIG. 9, a plurality of switches are used to selectively couple the transmission lines as necessary. Any number of transmission stubs may be used to tune the fixed delay element. Similarly, the delay elements 831 and 841 consist of a fixed delay element (825 and 835) coupled to a plurality of transmission line stubs (824, 830 and 832 and 838, 839 and 843) through transistors (826, 828, 834 and 836, 840 and 842). Although the transmission line stubs shown in FIG. 9 are parallel to the fixed delay element, any combination of serial and/or parallel configurations of transmission line stubs may be used to obtain the desired time delay for the delay element. For this embodiment, the control loop adjusts the parameters in the delay elements through the control lines that turn on and off the transistors (826, 828, 834 and 836, 840 and 842).

Figure 10:
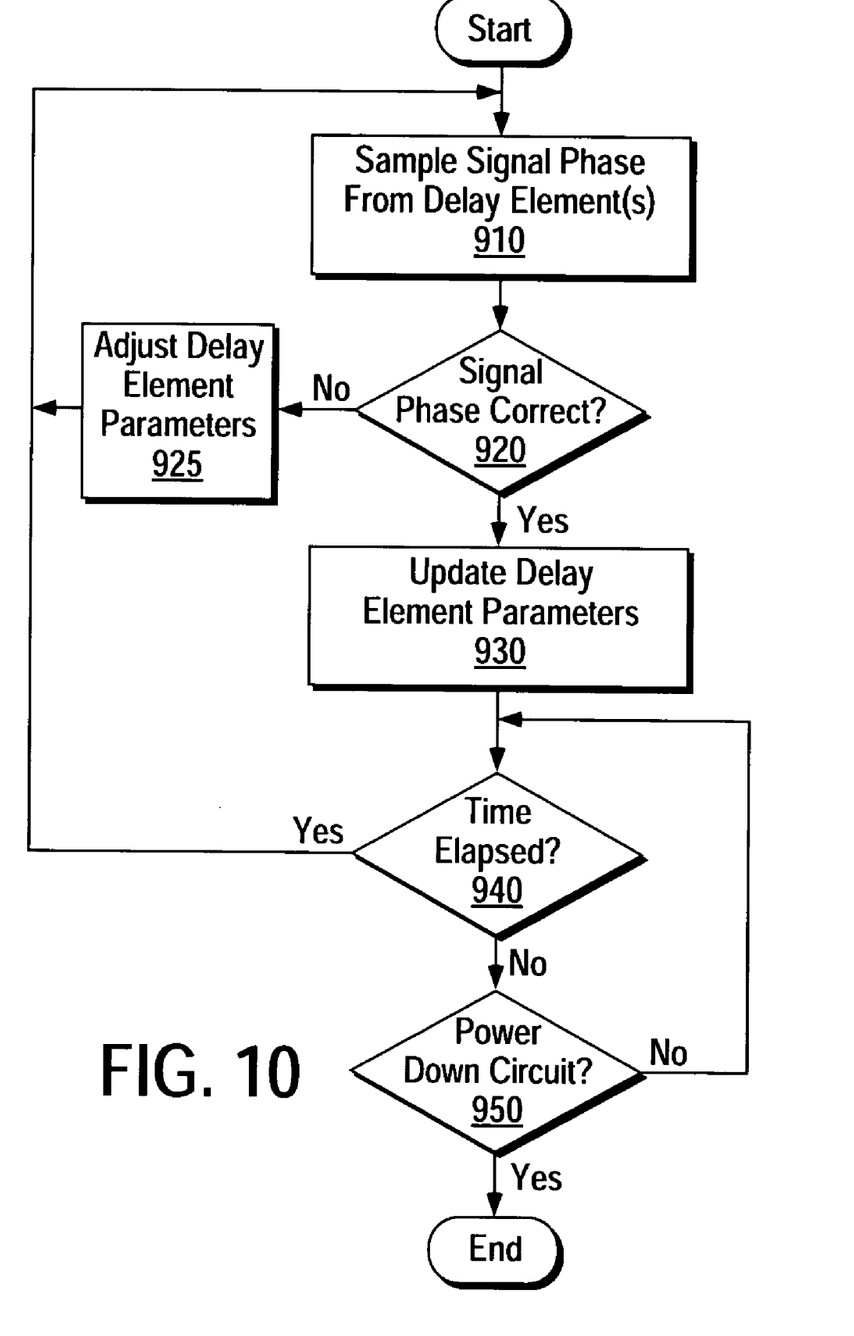
FIG. 10 is a flow diagram illustrating one embodiment for tuning the delay elements.

The tuning of the delay elements and the continuous time FIR filter can occur upon initial power up of the circuit, as well as through-out operation of the circuit. FIG. 10 is a flow diagram illustrating one embodiment for tuning the delay elements. Initially, a sample signal phase is obtained from the delay elements (block 910, FIG. 10). If the phase between the signals is not the desired phase, then the control loop generates an adjustment to the parameters of the delay element, and another sample of the signal phase from the delay elements is obtained (blocks 920, 925 and 910, FIG. 10). The loop, consisting of blocks 910, 920 and 925, is executed until the signal phase is the correct phase for the delay elements. If so, then the delay element parameters are updated (block 930, FIG. 10). For example, if the continuous time FIR filter is implemented using a master-slave configuration, then the settings in the reference delay elements are transferred to the delay element.

A time elapse, or any other criterion such as a temperature measurement or other parameter change, is selected to re-tune the delay elements. If the time has elapsed, then the delay elements are re-tuned (block 940, FIG. 10) by executing blocks 910, 920, 925 and 930. If the power to the circuit is shut off, then the process is terminated.

Figure 11:
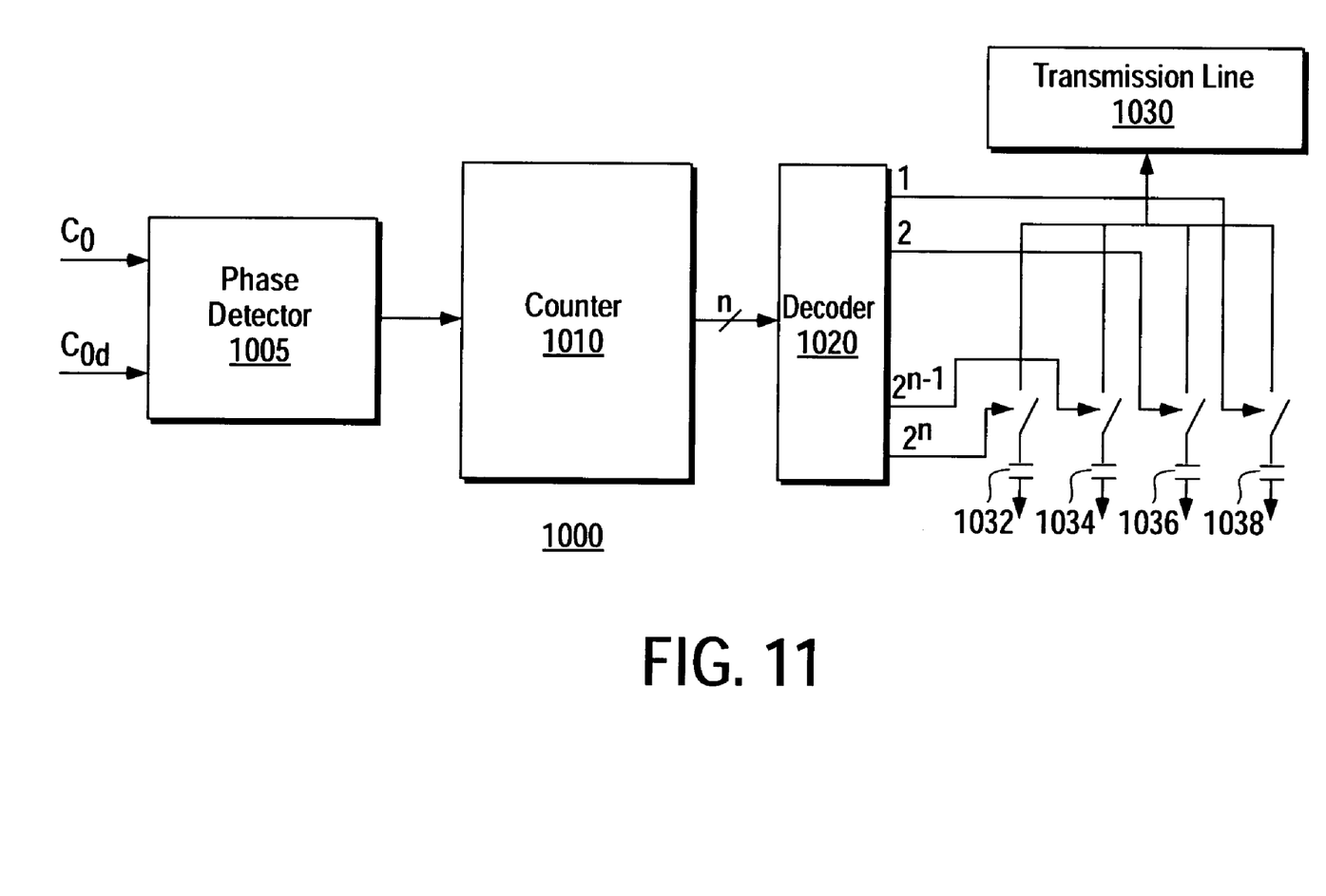
FIG. 11 is a block diagram illustrating one embodiment for a control loop and phase adjustment circuit for the clock and data recovery system.

FIG. 11 is a block diagram illustrating one embodiment for a control loop and phase adjustment circuit for the FIR equalizer. In general, the delay lock loop measures the phase difference between a signal at the beginning of the transmission line and a signal at the end of the transmission line, and varies the capacitance at the transmission line, based on a filtered value of this phase difference, until the overall delay of the transmission line equals the desired time delay. The example circuit of FIG. 11 illustrates one embodiment for a digital delay lock loop. Tabs from the start and end of a transmission line ($C_0$ and $C_{0d}$) are input to phase detector 1005. In general, phase detector 1005 measures the phase difference between $C_0$ and $C_{0d}$ to determine whether the phase of $C_0$ leads, lags or is in-phase with the phase of $C_{0d}$.

In one embodiment, phase detector 1005 is implemented as a low set-up time flip-flop. For this embodiment, $C_{0d}$ is the data input to the flip-flop, and $C_0$ is input to the clock. If the phase of the data input lags the phase of the clock, then the output of phase detector is a low logic level (e.g., "0"). Alternatively, if the phase of the data input leads the phase of the clock, then the output of the phase detector is a high logic level (e.g., "1"). The counter 1010, which receives the output of phase detector 1005, accumulates signals every cycle of the counter frequency. Thus, counter 1010 counts up if the phase of Cod leads the phase of $C^0$. Alternatively, counter 1010 counts down if the phase of $C_{0d}$ lags the phase of $C_0$. The counter frequency, which sets the loop response parameter, is an integer sub-multiple of the clock frequency, $C_0$. However, it is not required that the counter operates at the same frequency as $C_0$.

As shown in FIG. 11, the output of counter 1010, an n bit value, is converted to "$2^n$" control lines through decoder 1020. Each control line is coupled to a switch, which in turn, couples a capacitor (1032, 1034, 1036 or 1038) to transmission line 1030. By turning on and off the switches, the output of counter 1010 effectively increases or decreases the capacitance per unit length of the transmission line segments. In one embodiment, the capacitors (1032, 1034, 1036 and 1038) are binary sized to ensure a linear delay transfer function. In one embodiment, the capacitors are implemented with metal insulator metal (MiM) capacitors. Thus, using this configuration, the delay of transmission line 1030 is increased if $C_{0d}$ leads $C_0$, and is decreased if $C_{0d}$ lags $C_0$. The feedback loop closed at the phase detector ensures that the average phase of $C_0$ is the same as the average phase of $C_{0d}$ with the exception of some dithering. This dithering determines the minimum capacitor size selected. In another embodiment, the delay lock loop further includes a binary to thermometer code detector to convert the N bit counter output to $2^N$ control lines that control $2^N$ identical capacitors. This alternative embodiment has the advantage of exhibiting lower transient delay variations.

Figure 12:
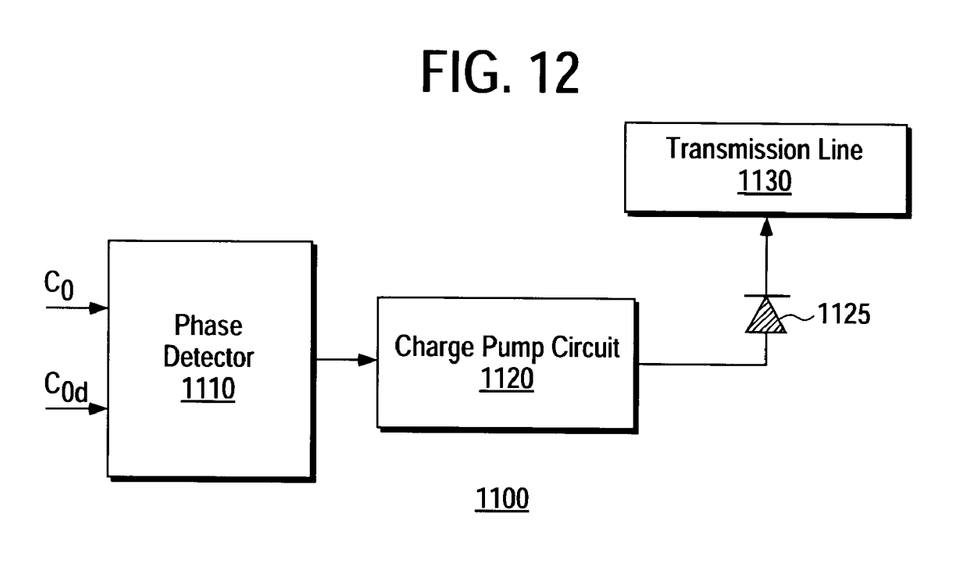
FIG. 12 is a block diagram illustrating another embodiment for implementing a delay lock loop for use with a transmission line.

In another embodiment, the delay lock loop may be implemented using analog components. FIG. 12 is a block diagram illustrating another embodiment for implementing a delay lock loop for use with a transmission line. For this embodiment, phase detector 1110 generates a voltage indicative of the phase difference between $C_0$ and $C_{0d}$. The filter for the delay lock loop implementation of FIG. 12 comprises the charge pump circuit 1120. For this embodiment, the charge pump circuit 1120 is coupled to the control voltage of a varactor (e.g., either PN junction or MOSFET). The varactor 1125, coupled to transmission line 1130, induces capacitance on transmission line 1130. When a voltage is applied to a PN junction to reverse bias the junction, the holes in the p-region are attracted to the anode terminal and the electrons in the n-region are attracted to the cathode terminal. This region, the depletion region, is essentially devoid of carriers, and thus behaves as a dielectric of a capacitor.

In one embodiment, the loop bandwidth of the delay lock loop is at least a factor of 10 from the loop bandwidth of the phase lock loop of the local clock generator. This difference in the respective loop bandwidths avoids interactions between the phase lock loop and the delay lock loop. The delay variations of the transmission line are fairly small resulting in a very small DLL open loop gain.

Figure 13A:
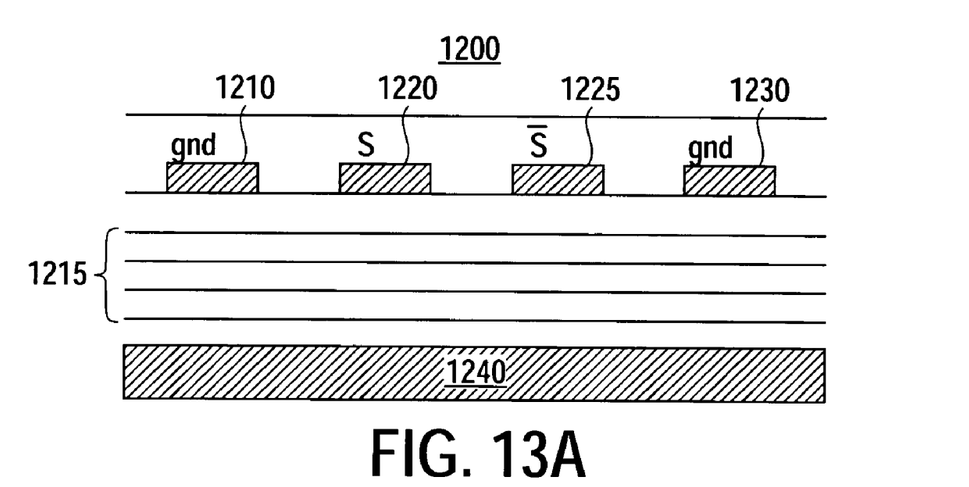
FIG. 13A illustrates a cross-section of an integrated circuit that implements a differential transmission line.
Figure 13B:
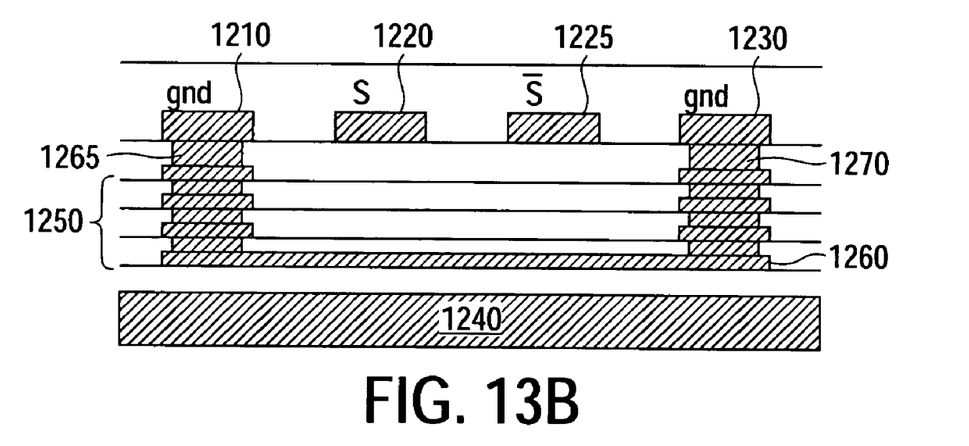
FIG. 13B illustrates a cross-section of an integrated circuit for an on-chip differential transmission line that includes shielding.

The transmission line for the continuous time FIR filter may be implemented either directly on an integrated circuit chip or off the integrated circuit chip. FIGS. 13A and B illustrate embodiments for implementing the transmission lines directly on an integrated circuit chip. In one embodiment, for the on-chip implementation, the transmission line is implemented as a coplanar waveguide. The transmission line may be either differential or single ended. FIG. 13A illustrates a cross-section of an integrated circuit that implements a differential transmission line. An integrated circuit 1200 includes a semiconductor substrate 1240. Deposited on top of the semiconductor substrate 1240 is a plurality of dielectric layers, labeled 1215 on FIG. 13A. For this embodiment, the differential coplanar waveguide is implemented on the top metal layer with ground conductors 1210 and 1230, signal conductor 1220, and negative signal conductor 1225. In typical semiconductor processing, which utilizes copper interconnect lines, the transmission line may be implemented at the top metal layer so as to minimize loss from the semiconductor substrate. Although the conductors of the waveguide of FIGS. 13A and 13B are shown in a differential configuration, a single ended waveguide, with only a signal and ground conductors, may be used.

In another embodiment, an on-chip transmission line may be shielded from the semiconductor substrate. FIG. 13B illustrates a cross-section of an integrated circuit for an on-chip differential transmission line that includes shielding. As shown in FIG. 13B, the metal layers 1250 include a metal shield 1260 at the lowest metal layer. The shield 1260 is coupled to the ground conductors of the waveguide through vias and interconnects 1265 and 1270. The shield 1260 shields the electromagnetic energy from penetrating from the waveguide into the lossy semiconductor substrate 1240. For example, for an eight (8) metal layer process with copper interconnect lines, the differential coplanar waveguide as shown in FIG. 13B, with nine micrometer by three micrometer top layer traces separated by nine micrometers, exhibits an attenuation coefficient of approximately 0.4 Neper/cm at 20 gigahertz. This attenuation amounts to approximately 30 percent signal loss per 60 pico second delay. This amount of delay is more than 1.5*Tbit at 40 Gps, which is sufficient for certain applications. Although some signal attenuation is inevitable at such high data rates, the use of shielding reduces the loss if the substrate is lossy.

Figure 14:
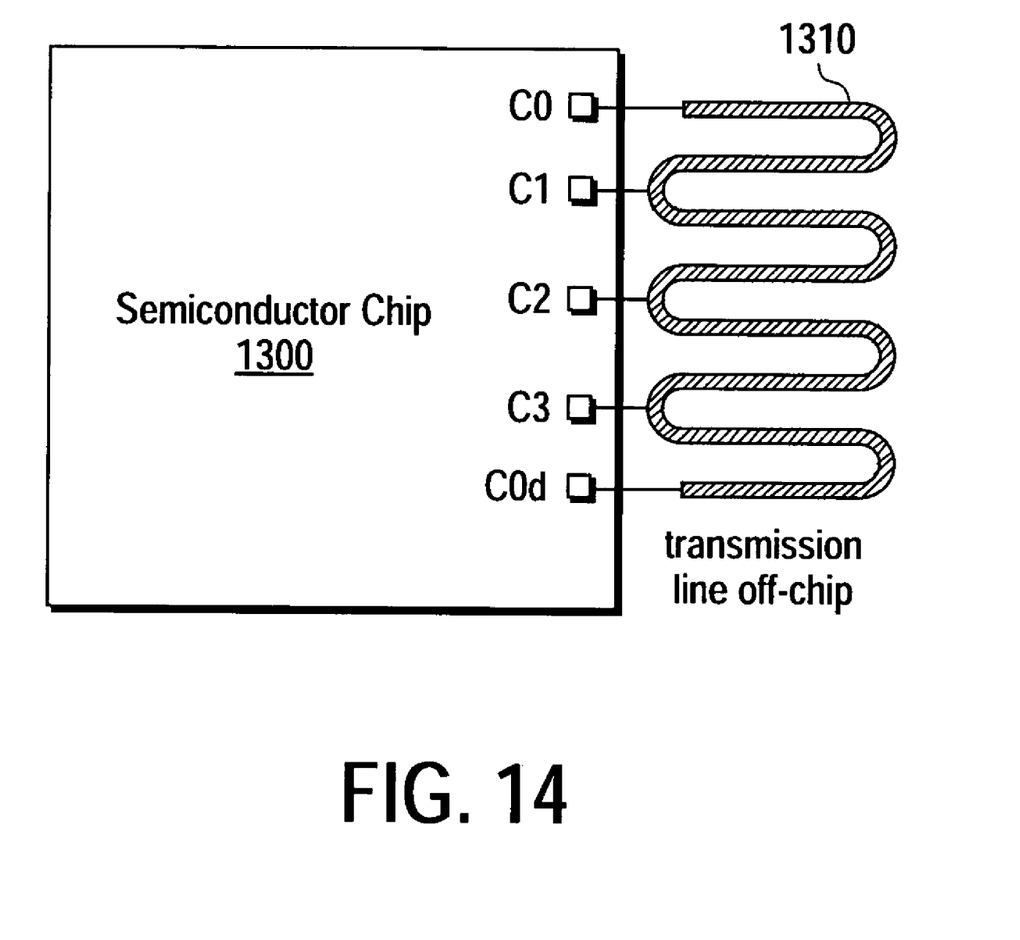
FIG. 14 illustrates one embodiment for implementing the transmission lines for the FIR filter off the integrated circuit chip.

FIG. 14 illustrates one embodiment for implementing the transmission lines for the FIR filter off the integrated circuit chip. The geometry of transmission line 1310 illustrates one possible configuration for a single ended transmission line on the package of the integrated circuit. The transmission line may be implemented on the integrated circuit package or on a printed circuit board for which the FIR filter circuit is mounted. For this embodiment, the circuit includes four delays (e.g., "N" equals four). As shown in FIG. 14, an integrated circuit 1300 includes a $C_0$ pin to couple the reference clock to the transmission line 1310. Additional clocks, generated from delay of transmission line 1310, are extracted at pins $C_1$, $C_2$, and $C_3$. The off chip implementation of transmission line 1310 allows for much thicker metallization than metallization that may be achieved on-chip. In addition, attenuation may be significantly reduced if the package substrate consists of a low loss dielectric. With an external transmission line, the tuning elements may still be internal to the chip.

Although the present invention has been described in terms of specific exemplary embodiments, it will be appreciated that various modifications and alterations might be made by those skilled in the art without departing from the spirit and scope of the invention.

What is claimed is:

1. A circuit comprising:
   at least one delay element for receiving an input signal and for generating a time delay in said signal to produce a time-delayed signal;
   calibration circuit, coupled to said delay element, for calibrating said delay element so as to match said time delay to a predetermined time period, said calibration circuit comprising a control loop for receiving an output signal from said delay element and a reference signal and for generating a phase adjustment based on a phase difference between said output and reference signals; and
   multiplier-summing circuit, coupled to said delay element, for multiplying at least one signal output from said delay element to produce at least one multiplied signal and for summing at least one multiplied signal to generate an equalized signal.

2. The circuit as set forth in claim 1, wherein:
   said delay element comprises selectable parameters for receiving a phase adjustment from said control loop and for setting said selectable parameters based on said phase adjustment.

3. The circuit as set forth in claim 2, wherein said control loop comprises:
   phase detector for measuring a said phase difference between said reference and output; and
   loop filter, coupled to receive a signal output from said phase detector, for generating said phase adjustment.

4. The circuit as set forth in claim 1, wherein said delay element comprises a transmission line.

5. The circuit as set forth in claim 4, wherein said delay element further comprises a means for adjusting capacitance for said transmission line, so as to calibrate said delay element.

6. The circuit as set forth in claim 1, wherein said delay element comprises lumped circuit elements.

7. The circuit as set forth in claim 6, wherein said delay element further comprises a means for selecting combinations of said lumped parameters to calibrate said delay element.

8. The circuit as set forth in claim 1, wherein said delay element comprises a plurality of stub transmission lines.

9. The circuit as set forth in claim 8, wherein said delay element further comprises a means for selecting a length of said stub transmission lines to calibrate said delay element.

10. The circuit as set forth in claim 1, wherein:
    said reference signal comprises said input signal; and
    said output signal comprises said time-delayed signal.

11. A method for filtering a signal, said method comprising the steps of:
    receiving an input signal in at least one delay element;
    generating a time delay in said signal to produce a time-delayed signal;
    calibrating said delay element so as to match said time delay to a predetermined time period, wherein said calibrating comprises:
      receiving an output signal from said delay element and a reference signal; and
      generating a phase adjustment based on a phase difference between said output and reference signals;
    multiplying at least one signal output from said delay element to produce at least one multiplied signal; and
    summing at least one multiplied signal to generate an equalized signal.

12. The method as set forth in claim 11, wherein:
    the step of receiving an input signal in at least one delay element comprises the steps of receiving an input signal in a delay element that comprises selectable parameters, receiving a phase adjustment, and setting said selectable parameters based on said phase adjustment.

13. The method as set forth in claim 12, wherein the step of generating a phase adjustment comprises the steps of:
    measuring said phase difference between said reference and output signals; and
    generating said phase adjustment.

14. The method as set forth in claim 11, wherein said delay element comprises a transmission line.

15. The method as set forth in claim 14, further comprising the steps of adjusting capacitance for said transmission line, so as to calibrate said delay element.

16. The method as set forth in claim 11, wherein said delay element comprises lumped circuit elements.

17. The method as set forth in claim 16, further comprising the step of selecting combinations of said lumped parameters to calibrate said delay element.

18. The method as set forth in claim 11, wherein said delay element comprises a plurality of stub transmission lines.

19. The method as set forth in claim 18, further comprising the step of selecting a length of said stub transmission lines to calibrate said delay element.

20. A circuit comprising:
    at least one delay element for receiving a signal and for generating a time delay in said signal, said delay element comprising a transmission line and a means for adjusting capacitance for said transmission line for calibrating said delay element;

calibration circuit, coupled to said delay element, for calibrating said delay element so as to match said time delay to a predetermined time period; wherein said calibration circuit generating a phase adjustment signal based on a phase difference between said output of said delay element and said signal and multiplier-summing circuit, coupled to said delay element, for multiplying at least one signal output from said delay element and for summing at least one multiplied signal to generate an equalized signal.

* * * * *